United States Patent
Zhang et al.

(10) Patent No.: US 9,746,728 B2
(45) Date of Patent: Aug. 29, 2017

(54) DISPLAY PANEL WITH METAL CONNECTING LINE AREA INCLUDING PROTECTIVE LAYER AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ming Zhang, Beijing (CN); Manman Wang, Beijing (CN); Guoqiang Zhang, Beijing (CN); Chao Fan, Beijing (CN); Qihui Wang, Beijing (CN); Zhongfei Bai, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/412,868

(22) PCT Filed: Jun. 30, 2014

(86) PCT No.: PCT/CN2014/081232
§ 371 (c)(1),
(2) Date: Jan. 5, 2015

(87) PCT Pub. No.: WO2015/096442
PCT Pub. Date: Jul. 2, 2015

(65) Prior Publication Data
US 2015/0185570 A1    Jul. 2, 2015

(30) Foreign Application Priority Data
Dec. 27, 2013 (CN) .......................... 2013 1 0741938

(51) Int. Cl.
*H01L 27/12* (2006.01)
*H01L 29/786* (2006.01)
(Continued)

(52) U.S. Cl.
CPC ...... *G02F 1/136227* (2013.01); *G02F 1/1345* (2013.01); *G02F 1/1368* (2013.01);
(Continued)

(58) Field of Classification Search
None
See application file for complete search history.

(56) References Cited

U.S. PATENT DOCUMENTS

2004/0266041 A1* 12/2004 Kim .................... G02F 1/13458
438/30
2009/0026444 A1* 1/2009 Choi .................... H01L 27/283
257/40
(Continued)

FOREIGN PATENT DOCUMENTS

CN      101387799 A    3/2009
CN      102064180 A    5/2011
(Continued)

OTHER PUBLICATIONS

Chinese Office Action of Chinese Application No. 201310741938.4, mailed Aug. 28, 2015 with English translation.
(Continued)

*Primary Examiner* — Daniel Whalen
(74) *Attorney, Agent, or Firm* — Collard & Roe, P.C.

(57) ABSTRACT

A display panel and a display device are provided to better protect a metal connecting line area in a peripheral wiring region, improve the protection degree and prevent the wire breakage. The display panel includes a gate insulating layer (102) disposed on a gate metal layer (101); and a protective layer (103), a passivation layer (105) and an indium tin
(Continued)

oxide (ITO) coating layer (107) disposed on the gate insulating layer in sequence. The display panel and the display device can increase the film thickness in the peripheral wiring region, and hence can protect the entire peripheral wiring region and particularly the metal connecting line area exposed outside a color filter panel and improve the protection degree.

10 Claims, 2 Drawing Sheets

(51) Int. Cl.
    *G02F 1/1362* (2006.01)
    *G02F 1/1368* (2006.01)
    *G02F 1/1345* (2006.01)
    *G02F 1/1333* (2006.01)

(52) U.S. Cl.
    CPC ...... *G02F 1/136286* (2013.01); *H01L 27/124* (2013.01); *H01L 29/78606* (2013.01); *G02F 1/133345* (2013.01); *G02F 2001/133388* (2013.01)

(56) References Cited

U.S. PATENT DOCUMENTS

| | | | |
|---|---|---|---|
| 2009/0121232 A1 | 5/2009 | Huh et al. | |
| 2011/0149188 A1 | 6/2011 | Ono et al. | |
| 2013/0181222 A1 | 7/2013 | Liu et al. | |
| 2014/0197414 A1 | 7/2014 | Guo | |
| 2016/0041433 A1* | 2/2016 | Zhang | G02F 1/1343 257/48 |

FOREIGN PATENT DOCUMENTS

| | | |
|---|---|---|
| CN | 102403311 A | 4/2012 |
| CN | 102646676 A | 8/2012 |
| CN | 202585418 U | 12/2012 |
| CN | 103472645 A | 12/2013 |
| CN | 103676354 A | 3/2014 |
| CN | 103676386 A | 3/2014 |
| CN | 103928453 A | 7/2014 |
| KR | 10-2008-0030195 A | 4/2008 |

OTHER PUBLICATIONS

International Search Report, International Preliminary Report on Patentability and Written Opinion of the International Searching Authority of PCT/CN2014/081232 in Chinese, mailed Sep. 30, 2014.
Second Chinese Office Action in Chinese Application No. 201310741938.4, mailed Jan. 21, 2016 with English translation.
English translation of the International Preliminary Report on Patentability and Written Opinion of the International Searching Authority of PCT/CN2014/081232, mailed Jun. 28, 2016.
Third Chinese Office Action in Chinese Application No. 201310741938.4, mailed Jun. 29, 2016 with English translation.

* cited by examiner

DISPLAY PANEL WITH METAL CONNECTING LINE AREA INCLUDING PROTECTIVE LAYER AND DISPLAY DEVICE

CROSS REFERENCE TO RELATED APPLICATIONS

This application is the National Stage of PCT/CN2014/081232 filed on Jun. 30, 2014, which claims priority under 35 U.S.C. §119 of Chinese Application No. 201310741938.4 filed on Dec. 27, 2013, the disclosure of which is incorporated by reference.

TECHNICAL FIELD

The present disclosure relates to a display panel and a display device.

BACKGROUND

With the continuous development of display technology, thin film transistor liquid crystal display devices are more and more widely applied.

A display panel of a thin film transistor liquid crystal display device known by the inventor includes a peripheral wiring region in which signal lines inside the display panel are led out by through-hole switching technique. The peripheral wiring region includes a signal line side peripheral wiring region and a gate line side peripheral wiring region. In the signal line side peripheral wiring region, data signal lines are led out by a data metal layer (SD metal layer) for preparing a source electrode and a drain electrode of a thin film transistor via the through-hole switching technique; and in the gate line side peripheral wiring region, gate signal lines are led out by a gate metal layer for preparing a gate electrode of the thin film transistor.

In the manufacturing process, in the peripheral wiring region, the gate signal lines and the data signal lines inside the display panel are led out, and bonding pads are provided to facilitate the connection between the display panel and a chip or an external circuit board, so in general, an array substrate is longer than a color filter substrate, so as to expose a line concentration area of the peripheral wiring portion. In the transmission process during the production of the display panel, the exposed line concentration area tends to be scratched due to collision, glass shards or the like. A typical scratch tends to occur at a metal connecting line area between a sealant frame and a bonding pad area. After a metal connecting line is scratched, data signal voltages cannot be applied to the display panel, and this can cause problems such as an X-line of the panel, which is generally an all-black line in a display area, and a Y-line of the panel.

In order to avoid the above-mentioned defects, the inventor knows that a coating layer made from indium tin oxide (short for ITO) can be adopted. That is to say, an ITO layer is disposed at a position of a metal connecting line between a bonding pad and the edge of a color filter substrate. As illustrated in FIG. 1A, a signal line side metal connecting line area includes a data metal layer 0, a passivation layer 5, an ITO coating layer 6 and an ITO protective layer 7. As illustrated in FIG. 1B, a gate line side metal connecting line area includes a gate metal layer 1, a gate insulating layer 2, a passivation layer 5, an ITO coating layer 6 and an ITO protective layer 7. As illustrated in FIGS. 1A and 1B, a certain distance d is formed between the ITO coating layer 6 and the ITO protective layer 7. Thus, good protection cannot be provided at a position not covered by the ITO coating layer 6 or the ITO protective layer 7. Moreover, even if the positions covered by the ITO layers are expanded, as the ITO layers are relatively thin, the protection degree is also limited.

By adoption of the above-mentioned ITO coating layer, scratches for the gate line side peripheral wiring region can be reduced to a certain degree, but the protective capability for the signal line side peripheral wiring region is still inadequate. Another protective means known by the inventor is that: on the basis of using an ITO coating layer, data signal lines are also subjected to through-hole switching by the gate metal layer to form a signal line side peripheral wiring region. On one hand, as the gate metal layer is formed using one wet etching process, the problem that the wiring of the line concentration area is affected by the defects such as active tail due to the use of dry etching and wet etching for a data metal layer can be avoided. On the other hand, as the data signal lines are subjected to through-hole switching by the gate metal layer to form the signal line side peripheral wiring region, there are also two layers, namely a gate metal layer and a gate insulating layer, at positions, not covered by the ITO coating layer, in the signal line side peripheral wiring region, and hence the influence brought by scratches can be reduced to a certain degree and the probability of the defects such as X-line caused by the wire breakage in the signal line side peripheral wiring region can be reduced.

However, in the above-mentioned protective means, as the protective layer is still relatively thin, the protective capability is also inadequate, and hence the problems such as X-line and Y-line are still relatively severe.

SUMMARY

Embodiments of the present disclosure provide a display panel and a display device, so as to better protect a peripheral wiring region and improve the protection degree.

In an aspect, an embodiment of the disclosure provides a display panel, and the display panel includes a peripheral wiring region in which a gate signal line and a data signal line are respectively led out by a gate metal layer via a through hole; the peripheral wiring region includes a metal connecting line area, and the metal connecting line area includes: a gate insulating layer disposed on the gate metal layer; and a protective layer, a passivation layer and an indium tin oxide (ITO) coating layer disposed on the gate insulating layer in sequence.

In the display panel provided by embodiments of the disclosure, the film thickness in the peripheral wiring region is increased, and hence the display panel can the entire peripheral wiring region and particularly the metal connecting line area exposed outside a color filter panel and improve the protection degree.

As for the display panel manufactured by using five-mask process, the protective layer is provided in a same layer and made from a same material as an active layer of a thin film transistor of the display panel, namely the protective layer is formed through an active layer metal forming the active layer. This brings a simple process, and using the active layer as the protective layer can avoid the defect of electrostatic breakdown generated due to the existence of a metal at the position As for the display panel manufactured by using five-mask process, the protective layer is provided in a same layer and made of a same material as source/drain electrodes of the thin film transistor of the display panel, namely the protective layer is formed through a data metal layer forming the source/drain electrodes, and this brings a simple process.

As for the display panel manufactured by using four-mask process, the protective layer includes a first protective layer and a second protective layer; the first protective layer is provided in a same layer and made from a same material with the active layer of the thin film transistor of the display panel, and the second protective layer is provided in a same layer and made from a same material with the source/drain electrodes of the thin film transistor of the display panel.

In the display panel manufactured by using four-mask process, the active layer and a source/drain metal are formed by using a same mask process, so the embodiment of the disclosure provides the protective layer with a first protective layer and a second protective layer; the first protective layer is provided in a same layer and made from a same material with the active layer of the thin film transistor of the display panel; and the second protective layer is provided in a same layer and made from a same material with the source/drain electrodes of the thin film transistor of the display panel. This brings a simple manufacturing process.

For example, in the display panel formed by preparing an organic film on an array substrate via an organic insulator material technology, the protective layer is provided in a same layer and made from a same material as the organic film formed on the array substrate of the display panel, so that the manufacturing process is simple.

For example, in the display panel formed by preparing a color filter layer on an array substrate via the COA (color filter on array) technology, the protective layer is provided in a same layer and made from a same material as the color filter layer formed on the array substrate of the display panel, so that the manufacturing process is simple.

The passivation layer includes a first extension configured to cover a side fracture surface of a first protective layer, exposed by a through hole, and a side fracture surface of a second protective layer, exposed by the through hole, so that the ITO protective layer does not contact with the second protective layer prepared by the data metal layer, so as to avoid the short circuit The passivation layer further includes a second extension configured for covering an upper surface of the gate insulating layer, and this can better prevent the problem of short circuit between the ITO protective layer and the data metal layer caused by overetching in the process of forming the through hole.

The protective layer can include a strip structure, so as to prevent the problem of short circuit which can be caused by the connection between an anisotropic conductive adhesive and the data metal layer after the passivation layer is scratched in a certain condition.

The protective layer can further include a platy structure, which needs no further processing technic and brings a simple manufacturing process.

In another aspect, an embodiment of the disclosure further provides a display device, and the display device includes the above-mentioned display panel.

In the display panel of a display device, provided by the embodiments of the present disclosure, the gate signal line and the data signal line are subjected to through-hole switching by the gate metal layer to form the peripheral wiring region; the gate insulating layer is formed in the peripheral wiring region; and the protective layer, the passivation layer and the ITO coating layer are disposed on the gate insulating layer in sequence. Therefore, the film thickness in the peripheral wiring region is increased, and hence the entire peripheral wiring region and particularly the metal connecting line area exposed outside the color filter panel can be protected. Thus, the protection degree is improved.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
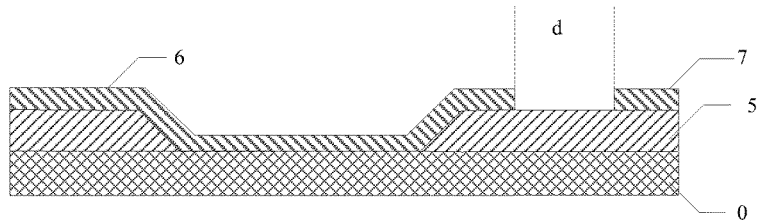
FIG. 1A is a schematic structural view of a signal line side metal connecting line area known by the inventor.
Figure 1B:
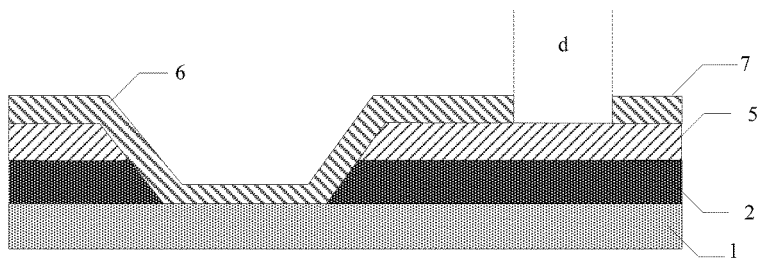
FIG. 1B is a schematic structural view of a gate line side metal connecting line area in a current technology.
Figure 2:
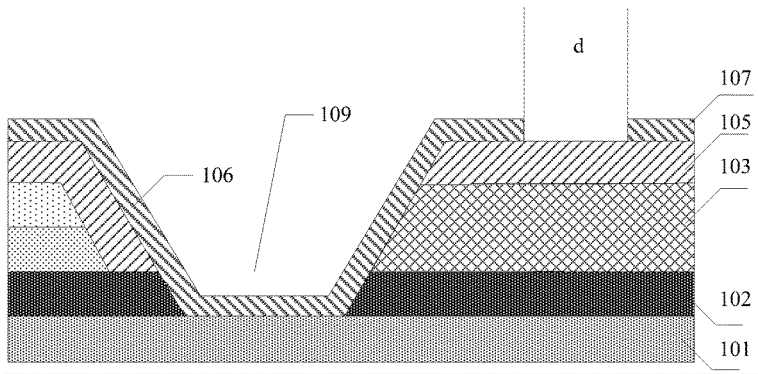
FIG. 2 is a schematic structural view of a metal connecting line area in a peripheral wiring region of a display panel provided by an embodiment of the present disclosure.

Embodiments of the present disclosure provides a display panel, and the display panel includes a peripheral wiring region in which a gate signal line and a data signal line are respectively switched via a through hole by a gate metal layer. As illustrated in FIG. 2, a metal connecting line area in the peripheral wiring region includes: a gate metal layer 101; a gate insulating layer 102 disposed on the gate metal layer 101; and a protective layer 103, a passivation layer 105 and an ITO layer disposed on the gate insulating layer 102 in sequence. The ITO layer includes an ITO protective layer 106 and an ITO coating layer 107 generally provided in a same layer.

Specific materials of the protective layer 103 disposed on the gate insulating layer are not limited in the embodiments of the present disclosure. In order to simplify the manufacturing process, in embodiments of the present disclosure, the protective layer 103 may be prepared by using an active layer material for preparing an active layer of a thin film transistor of the display panel and/or a data metal layer for preparing source/drain electrodes of the thin film transistor, and may also be prepared by an organic film via an organic insulator material technology (for instance, in an HADS mode, an organic insulating material may be disposed between source/drain electrode signal lines and a common electrode to reduce the capacitance therein, by adding an organic film) or prepared by a color filter layer via a color filter on array (short for COA) technology. When the organic insulator material technology is adopted, the organic film may be disposed between a source/drain electrode signal line and the common electrode. When the COA technology is adopted, the color filter layer may be disposed on the ITO coating layer 107 and may also be disposed on any layer on a glass substrate.

In embodiments of the present disclosure, as the protective layer, apart from the gate insulating layer, the passivation layer and the ITO coating layer, is disposed in the metal connecting line area in the peripheral wiring region, the thickness of films in the metal connecting line area in the peripheral wiring region can be increased. By utilization of the films with the increased thickness, the metal connecting line area in the peripheral wiring region during the cutting process can be more effectively prevented from being scratched, to avoid the problems such as X-line caused thereby, particularly positions of connecting lines between bonding pads in the peripheral wiring region and the edge of a color filter substrate can be protected. Therefore, poor display of a liquid crystal display panel, caused by the frequently-occurring wire breakage at the positions, can be effectively reduced and the product yield can be improved.

In embodiments of the present disclosure, different protective layers may be selected according to different manufacturing processes of the display panel. For instance, in an embodiment of the present disclosure, a data metal layer and/or an active layer metal may be selected to prepare the protective layer according to different mask processes adopted. When a four-mask process is adopted, the data metal layer and the active layer are prepared by using a same mask process. Thus, as for a display panel manufactured by four-mask process, by changing a mask pattern, both the data metal layer and the active layer in the metal connecting line area in the peripheral wiring region can be retained to form a protective layer including a first protective layer and a second protective layer; the first protective layer is provided in a same layer and made from a same material with the active layer of the thin film transistor of the display panel, and the second protective layer is provided in a same layer and made from a same material with source/drain electrodes of the thin film transistor of the display panel.

As for a display panel manufactured by five-mask process, the data metal layer and the active layer are prepared by using different mask processes. Thus, as for the protective layer in the metal connecting line area in the peripheral wiring region of the display panel manufactured by five-mask process, any one of the data metal layer and the active layer may be retained to form a single protective layer structure. As illustrated in FIG. 2, the protective layer is provided in a same layer and made from a same material as the active layer of the thin film transistor of the display panel; or the protective layer is provided in a same layer and made from a same material as source/drain electrodes of the thin film transistor of the display panel. The data metal layer and the active layer may also be retained at the same time to form a double protective layer structure including a first protective layer and a second protective layer.

In embodiments of the present disclosure, when the display panel is manufactured by five-mask process and the active layer is retained in the metal connecting line area in the peripheral wiring region, the protective layer provided in a same layer and made from a same material as the active layer of the thin film transistor of the display panel is formed, and this avoids the defect of electrostatic breakdown generated due to the existence of a metal at the position.

Moreover, in embodiments of the present disclosure, the metal connecting line area, in the peripheral wiring region where the data signal line and the gate signal line are led out by the gate metal layer, includes an ITO protective layer. In order to avoid the short circuit between the ITO protective layer and the protective layer prepared by the data metal layer and/or the active layer, in an embodiment of the present disclosure, a first extension made from an insulating material is formed and configured to cover a side fracture surface of a first protective layer, exposed by a through hole, and a side fracture surface of a second protective layer, exposed by the through hole. Thus, the ITO protective layer does not contact with the second protective layer prepared by the data metal layer, so as to avoid the short circuit.

Figure 3:
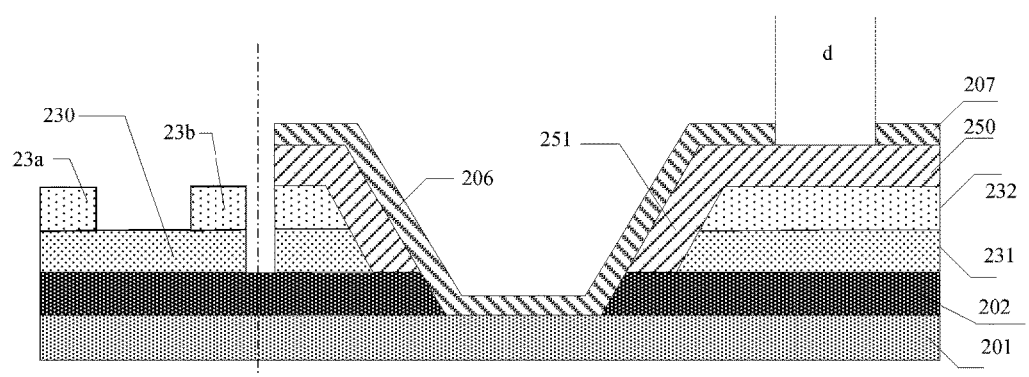
FIG. 3 is another schematic structural view of a metal connecting line area in a peripheral wiring region of a display panel provided by an embodiment of the present disclosure.

FIG. 3 is a schematic structural view of a metal connecting line area in a peripheral wiring region of a display panel provided by an embodiment of the present disclosure. As illustrated in FIG. 3, the metal connecting line area in the peripheral wiring region of the display panel includes a gate metal layer 201, a gate insulating layer 202, a first protective layer 231, a second protective layer 232, a passivation layer 250, an ITO protective layer 206 and an ITO coating layer 207.

The ITO coating layer 207 covers the passivation layer 250, and a preset distance d is formed between the ITO coating layer 207 and the ITO protective layer 206.

The passivation layer 250 includes a first extension 251 configured for covering a side fracture surface of the first protective layer 231, exposed by a through hole, and a side fracture surface of the second protective layer 232, exposed by the through hole.

Specifically, a covering structure on the passivation layer 250 shown in FIG. 3 can be formed by using the following through-hole process. The through-hole process includes the following steps.

A: forming an active layer 231 taken as the first protective layer and a data metal layer 232 taken as the second protective layer on the gate metal layer 201 configured for covering the gate insulating layer 202.

B: performing a through-hole etching process to the active layer 231 taken as the first protective layer and the data metal layer 232 taken as the second protective layer, to form a first through hole, so that an upper surface of the gate insulating layer 202 is exposed by a bottom surface of the first through hole, and a side fracture surface of the active layer 231 and a side fracture surface of the data metal layer 232 are exposed by a side wall of the first through hole.

C: forming the passivation layer 250 in the first through hole, so that the passivation layer 250 covers an upper surface of the data metal layer 232, the side fracture surface of the data metal layer 232 exposed by the first through hole, and the side fracture surface of the active layer 231 exposed by the first through hole.

D: performing a through-hole etching process to the passivation layer 250 and the gate insulating layer 202 to form a second through hole, and finally connecting the gate signal line or the data signal line and the gate metal layer 201 by the ITO protective layer 206.

The dimension of the second through hole is equivalent to that of the first through hole as long as the passivation layer 250 configured for covering the side fracture surface of the data metal layer 232 and the side fracture surface of the active layer 231 is retained.

Figure 4:
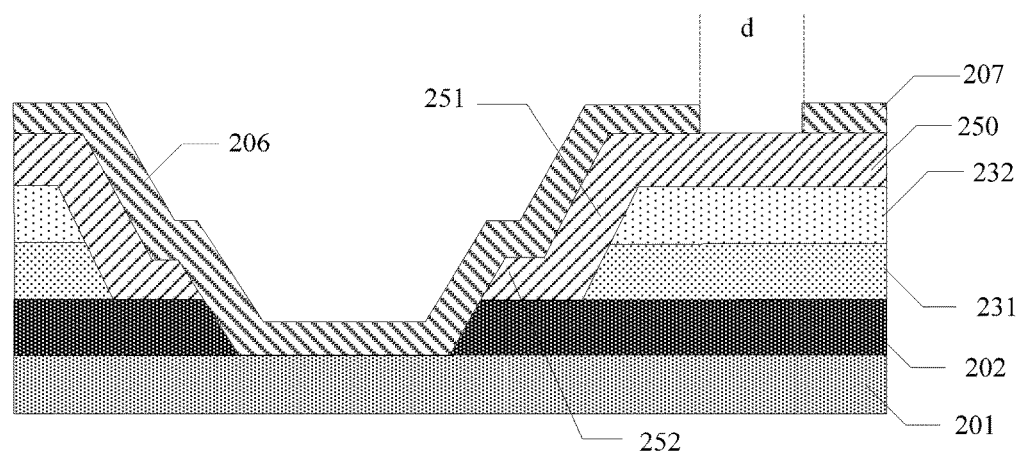
FIG. 4 is a further schematic structural view of a metal connecting line area in a peripheral wiring region of a display panel provided by an embodiment of the present disclosure.

Moreover, in an embodiment of the present disclosure, the passivation layer 250 may further include a second extension 252 configured for covering the upper surface of the gate insulating layer, and a structure shown in FIG. 4 is formed. The difference between the structure of the metal connecting line area in the peripheral wiring region of the display panel in FIG. 4 and the structure of the metal connecting line area in the peripheral wiring region of the display panel in FIG. 3 is that: the passivation layer 250 further includes the second extension 252 configured for covering the gate insulating layer 202. By the second extension 252, the problem of short circuit between the ITO protective layer and the data metal layer caused by over-etching in the process of forming the second through hole can be better prevented.

For instance, the through-hole process for forming the covering structure of the passivation layer, as shown in FIG. 4, is similar to the through-hole process for forming the covering structure of the passivation layer, as shown in FIG. 3, with the only difference that the formed second through hole is made to be relatively smaller than the first through hole in the process of forming the second through hole.

Detailed description will be given to the structures of the display panel involved in the embodiments of the present disclosure with reference to the structures of the metal connecting line area in the peripheral wiring region, as shown in FIGS. 1A, 1B, 3 and 4.

In embodiments of the present disclosure, the protection degree is mainly improved by increasing the thickness of the protective layer in the metal connecting line area in the peripheral wiring region. With respect to the example of a 32-inch advanced super dimension switch (ADS) product manufactured by four-mask technology, in the technical proposal shown in FIG. 1A, the protective layer in the metal connecting line area in the signal line side peripheral wiring region includes a passivation layer (PVX) and an ITO coating layer, with the total thickness of 4,400 Å, in which the thickness of the passivation layer is 4,000 Å and the thickness of the ITO coating layer is 400 Å. Compared with the case, in the technical proposals of the embodiments of the present disclosure, as shown in FIGS. 3 and 4, the protective layer includes a gate insulating layer, an active layer, a data metal layer, a passivation layer and an ITO coating layer, with the total thickness of 14,650 Å, in which the thickness of the active layer is 2,300 Å; the thickness of the data metal layer is 3,950 Å; the thickness of the passivation layer is 4,000 Å; and the thickness of the ITO coating layer is 400 Å. Therefore, according to the embodiments of the present disclosure, the thickness and the strength of the protective layer are obviously increased. In the technical proposal shown in FIG. 1B, the protective layer in the metal connecting line area in the gate line side peripheral wiring region includes a gate insulating layer, a passivation layer and an ITO coating layer. Compared with the case, in the technical proposals shown in FIGS. 3 and 4, the protective layer includes the gate insulating layer, the active layer, the data metal layer, the passivation layer and the ITO coating layer, and hence the protective capability can be increased compared with the case that only one ITO coating layer is disposed in the metal connecting line area in the peripheral wiring region.

In an embodiment of the present disclosure, in a display panel formed by preparing an organic film on an array substrate via an organic insulator material technology, the protective layer may be provided in a same layer and made from a same material as the organic film formed on the array substrate of the display panel, so that the manufacturing process is simple. The specific structure is the same with the structure shown in FIG. 2, in which the film 103 herein between the ITO coating layer 107 and the gate metal layer 101 may be an organic film.

In an embodiment of the present disclosure, in a display panel formed by preparing a color filter layer on an array substrate via the COA (color filter on array) technology, the protective layer may be provided in a same layer and made from a same material as the color filter layer formed on the array substrate of the display panel, so that the manufacturing process is simple. The specific structure is the same with the structure shown in FIG. 2. Or the color filter layer can be provided on the ITO layer, e.g., may be disposed on the ITO protective layer 106 and the ITO coating layer 107, as shown in FIG. 2. The color filter layer may also be taken as any layer disposed on the glass substrate. Moreover, in an embodiment of the present disclosure, the protective layer disposed on the gate insulating layer may be a platy coating protective layer, so that the manufacturing process can be simplified. The protective layer may also be provided with a strip structure by etching process. Thus, the problem of short circuit which can be caused by the connection between an anisotropic conductive adhesive and the data metal layer after the passivation layer is scratched in a certain condition can be prevented.

An embodiment of the present disclosure further provides a display device, which includes the above-mentioned display panel. No further description will be given herein to other components of the display device.

The display panel in the display device provided by the embodiment of the present disclosure includes the peripheral wiring region formed by the through-hole switching of the gate signal line and the data signal line via the gate metal layer, and the metal connecting line area in the peripheral wiring region includes the gate insulating layer and the protective layer, the passivation layer and the ITO coating layer disposed on the gate insulating layer in sequence. Therefore, the entire peripheral wiring region and particularly the metal connecting lines exposed outside the color filter panel can be protected. Compared with the case of arranging one ITO coating layer, the thickness of the protective layer is increased and the protection degree is improved.

The foregoing descriptions are preferred embodiments of the present disclosure. It should be noted that various modifications and variations may be also made by those skilled in the art without departing from the technical principle of the present disclosure and shall also fall within the scope of protection of the present disclosure.

The application claims priority to the Chinese Patent Application No. 201310741938.4 submitted on Dec. 27, 2013. The disclosure content of the Chinese Patent Application is incorporated herein as part of the application.

What is claimed is:

1. A display panel, comprising a peripheral wiring region, wherein the peripheral wiring region comprises a metal connecting line area, and the metal connecting line area comprises:

a gate insulating layer disposed on a gate metal layer; and a protective layer, a passivation layer and an indium tin oxide (ITO) coating layer disposed on the gate insulating layer in sequence; and a through hole is provided in the gate insulating layer, the protective layer, and the passivation layer and exposes part of the gate metal layer, and the ITO coating layer is electrically connected with the exposed part of the gate metal layer via the through hole;

the protective layer comprises a first protective layer and a second protective layer; the first protective layer is provided in a same layer and made from a same material as an active layer of a thin film transistor of the display panel; and the second protective layer is provided in a same layer and made from a same material as source/drain electrodes of the thin film transistor of the display panel.

2. The display panel according to claim 1, wherein the passivation layer is provided with a first extension configured for covering a side fracture surface of the first protective layer, exposed by the through hole, and a side fracture surface of the second protective layer, exposed by the through hole.

3. The display panel according to claim 2, wherein the passivation layer is also provided with a second extension configured for covering an upper surface of the gate insulating layer.

4. The display panel according to claim 1, wherein the protective layer comprises a strip structure or a platy structure.

5. The display panel according to claim 1, wherein the metal connecting line area further comprises an ITO protective layer disposed at the through hole, and a portion, on the passivation layer, of the ITO protective layer is spaced from the ITO coating layer.

6. A display device, comprising a display panel, wherein the display panel comprises a peripheral wiring region, the peripheral wiring region comprises a metal connecting line area, and the metal connecting line area comprises:

a gate insulating layer disposed on a gate metal layer; and a protective layer, a passivation layer and an indium tin oxide (ITO) coating layer disposed on the gate insulating layer in sequence;

a through hole is provided in the gate insulating layer, the protective layer, and the passivation layer and exposes part of the gate metal layer, and the ITO coating layer is electrically connected with the exposed part of the gate metal layer via the through hole;

the protective layer comprises a first protective layer and a second protective layer; the first protective layer is provided in a same layer and made from a same material as an active layer of a thin film transistor of the display panel; and the second protective layer is provided in a same layer and made from a same material as source/drain electrodes of the thin film transistor of the display panel.

7. The display device according to claim 6, wherein the passivation layer is provided with a first extension configured for covering a side fracture surface of the first protective layer, exposed by the through hole, and a side fracture surface of the second protective layer, exposed by the through hole.

8. The display device according to claim 7, wherein the passivation layer is also provided with a second extension configured for covering an upper surface of the gate insulating layer.

9. The display device according to claim 6, wherein the protective layer comprises a strip structure or a platy structure.

10. The display panel according to claim 6, wherein the metal connecting line area further comprises an ITO protective layer disposed at the through hole, and a portion, on the passivation layer, of the ITO protective layer is spaced from the ITO coating layer.

* * * * *